US012598941B2

(12) United States Patent
Kagaya

(10) Patent No.: US 12,598,941 B2
(45) Date of Patent: Apr. 7, 2026

(54) APPARATUS FOR PROCESSING SUBSTRATE, DEVICE OF CONTROLLING APPARATUS FOR PROCESSING SUBSTRATE, METHOD OF CONTROLLING APPARATUS FOR PROCESSING SUBSTRATE, AND STORAGE MEDIUM THAT STORES PROGRAM

(71) Applicant: EBARA CORPORATION, Tokyo (JP)

(72) Inventor: Shunsuke Kagaya, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 610 days.

(21) Appl. No.: 18/075,195

(22) Filed: Dec. 5, 2022

(65) Prior Publication Data

US 2023/0175164 A1 Jun. 8, 2023

(30) Foreign Application Priority Data

Dec. 8, 2021 (JP) ................................ 2021-199133

(51) Int. Cl.
| | |
|---|---|
| *H01L 21/67* | (2006.01) |
| *C25D 17/00* | (2006.01) |
| *C25D 21/10* | (2006.01) |
| *C25D 21/12* | (2006.01) |
| *G05B 19/18* | (2006.01) |
| *H01L 21/677* | (2006.01) |

(52) U.S. Cl.
CPC ...... *H01L 21/67276* (2013.01); *C25D 17/001* (2013.01); *C25D 21/10* (2013.01); *C25D 21/12* (2013.01); *G05B 19/188* (2013.01); *H01L 21/67739* (2013.01); *G05B 2219/45031* (2013.01)

(58) Field of Classification Search
CPC ................................................ H01L 21/67276
See application file for complete search history.

(56) References Cited

U.S. PATENT DOCUMENTS

| | | |
|---|---|---|
| 2011/0172800 A1 | 7/2011 | Koizumi et al. |
| 2019/0237350 A1* | 8/2019 | Mitsuya ............ H01L 21/67161 |

FOREIGN PATENT DOCUMENTS

| | | |
|---|---|---|
| JP | 2011-146448 A | 7/2011 |
| JP | 2019-133998 A | 8/2019 |

* cited by examiner

*Primary Examiner* — Hosung Chung
(74) *Attorney, Agent, or Firm* — BakerHostetler

(57) ABSTRACT

One object of the present disclosure is to flexibly and promptly save a processing solution in an apparatus for processing a substrate. An apparatus for processing a substrate is configured to change over a transfer time table between an ordinary mode that has a maximum throughput of the apparatus for processing the substrate and a processing solution saving mode that saves a processing solution in at least one of processing tanks. The apparatus for processing the substrate determines whether or not the apparatus for processing the substrate is in a slack period that has a small demand output by the apparatus for processing the substrate, based on a rate-controlling point that limits a processing speed of the entire apparatus for processing the substrate, and sets the transfer time table to the processing solution saving mode when it is determined that the apparatus for processing the substrate is in the slack period, while setting the transfer time table to the ordinary mode when it is determined that the apparatus for processing the substrate is not in the slack period.

16 Claims, 11 Drawing Sheets

Fig. 6

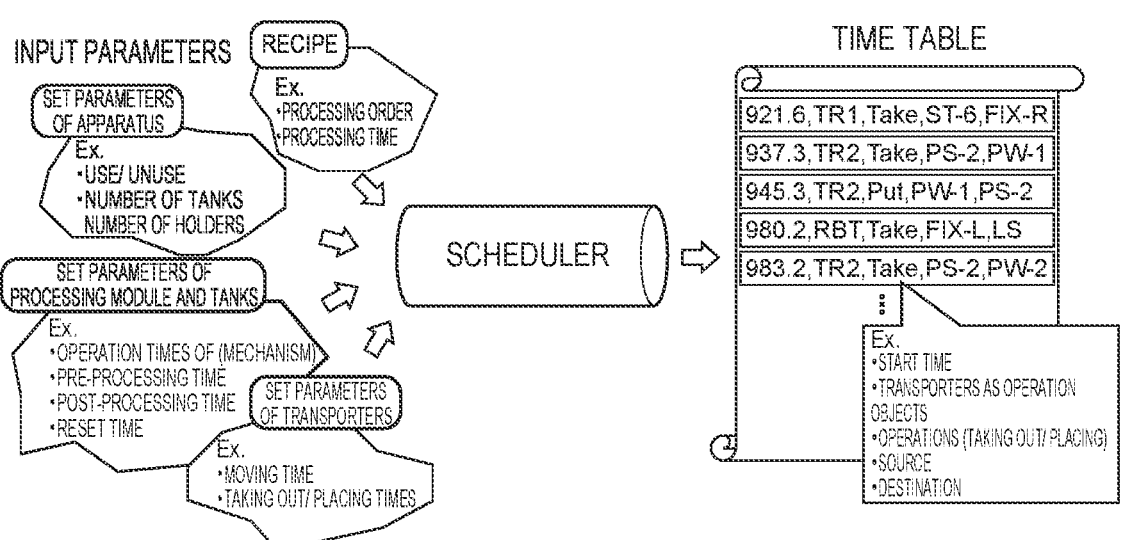

INPUT PARAMETERS

RECIPE

SET PARAMETERS OF APPARATUS

Ex.
•USE/ UNUSE
•NUMBER OF TANKS
•NUMBER OF HOLDERS

Ex.
•PROCESSING ORDER
•PROCESSING TIME

SET PARAMETERS OF PROCESSING MODULE AND TANKS

Ex.
•OPERATION TIMES OF (MECHANISM)
•PRE-PROCESSING TIME
•POST-PROCESSING TIME
•RESET TIME

SET PARAMETERS OF TRANSPORTERS

Ex.
•MOVING TIME
•TAKING OUT/ PLACING TIMES

SCHEDULER

TIME TABLE

| 921.6,TR1,Take,ST-6,FIX-R |
| 937.3,TR2,Take,PS-2,PW-1 |
| 945.3,TR2,Put,PW-1,PS-2 |
| 980.2,RBT,Take,FIX-L,LS |
| 983.2,TR2,Take,PS-2,PW-2 |

Ex.
•START TIME
•TRANSPORTERS AS OPERATION OBJECTS
•OPERATIONS (TAKING OUT/ PLACING)
•SOURCE
•DESTINATION

APPARATUS FOR PROCESSING SUBSTRATE, DEVICE OF CONTROLLING APPARATUS FOR PROCESSING SUBSTRATE, METHOD OF CONTROLLING APPARATUS FOR PROCESSING SUBSTRATE, AND STORAGE MEDIUM THAT STORES PROGRAM

TECHNICAL FIELD

The present disclosure relates to an apparatus for processing a substrate, a device of controlling the apparatus for processing the substrate, a method of controlling the apparatus for processing the substrate, and a storage medium configured to store therein a program that causes a computer to perform the method of controlling the apparatus for processing the substrate.

BACKGROUND ART

There are various substrate processing apparatuses of various configurations. For example, the substrate processing apparatus has a plurality of processing tanks that store therein processing solutions (chemical solutions or pure water) and causes a substrate that is an object to be processed or a processing object, or a substrate holding mechanism that holds the substrate to be transferred between the plurality of processing tanks by a transfer mechanism for inter-tank conveyance and to be subjected to a plurality of different processes. In each of the processing tanks, the processing object is lifted down into the processing tank to be soaked in the processing solution by the transfer mechanism for inter-tank conveyance or by another lifting transfer mechanism. The processing object after a predetermined process is then lifted up or pulled up from the processing tank by the transfer mechanism for inter-tank conveyance or by the lifting transfer mechanism and is transferred to a next processing tank by the transfer mechanism for inter-tank conveyance. The lifting-down operation and the lifting-up operation are performed at preset speeds.

When the substrate processing apparatus receives an instruction for processing a newly carried-in substrate, a module called a substrate transfer scheduler (scheduling software) performs scheduling calculation to maximize the total number of substrates processed per unit time (throughput) by the entire apparatus, based on a plurality of given substrate processing conditions (for example, a plating time, a value of electric current, and a constraint of a transfer waiting time after the process) and setting information of an operation time of the transfer mechanism (refer to, for example, Japanese Unexamined Patent Publication No. 2011-146448 (Patent Document 1)). Each transfer control device performs a transfer operation of the substrate or the substrate holding mechanism that holds the substrate, based on generated time table data including information on, for example, the type of each operation and the starting time of each operation.

Japanese Unexamined Patent Publication No. 2019-133998 (Patent Document 2) discloses a technique of fixing a required pull-out time of the substrate from each processing tank, generating a transfer time table to have a maximum throughput, determining, based on a waiting time after placement of the substrate in one processing tank and a waiting time after processing of the substrate in the processing tank, whether the pull-out time of the substrate is extendable in an immediately preceding processing tank without decreasing the throughput, and correcting the transfer time table to extend the pull-out time of the substrate in the immediately preceding processing tank when it is determined that the pull-out time is extendable without decreasing the throughput.

RELATED ART DOCUMENT

Patent Document

Patent Document 1: Japanese Unexamined Patent Publication No. 2011-146448

Patent Document 2: Japanese Unexamined Patent Publication No. 2019-133998

SUMMARY OF INVENTION

Technical Problem

In general, in a system of soaking the substrate in a processing solution of a processing tank and pulling out the substrate from the processing tank, the processing solution adheres to the substrate and/or a substrate holder to be dragged out. There is accordingly a need to newly supply the processing solution corresponding to the drag-out amount. Since the processing solution is expensive, it is demanded to minimize the drag-out amount of the processing solution from the processing tank.

In an apparatus for manufacturing semiconductor, on the other hand, with a view to processing a larger number of substrates, parameters are adjusted to maximize the throughput in a range that does not affect the process. More specifically, the parameters are set in advance to achieve a maximum output in a peak period that has a large demand output. In a time period other than the peak period, however, priority may be given to saving of the processing solution over maximizing the output.

In such a case, there is a need to change the parameters of the apparatus (to change the parameters in the transfer time table). The operator is thus required to determine a procedure of changing the parameters according to the operation. If the operator is not able to make such a determination, however, there is a need to make an inquiry to a development team, check relevant parameters and setting values, and set the parameters based on a response from the development team, prior to the actual production. This takes time to wait for the response from the development team and may thus fail to make a flexible and prompt change.

Furthermore, after the change of the parameters to save the processing solution in the slack period, when the substrate processing apparatus reenters the peak period, the operator is required to properly return the parameters to the original settings, with a view to maximizing the throughput. Changing the parameters is generally performed by manual operation. There is accordingly a possibility of human error, for example, erroneous setting or a failure to return the setting.

The present invention aims to solve at least part of the problems described above. One object of the present disclosure is to provide a technique that flexibly and promptly saves a processing solution in an apparatus for processing a substrate. Another object of the present disclosure is to provide a technique that saves a processing solution, while suppressing a human error in the apparatus for processing the substrate.

Solution to Problem

According to one aspect, there is provided an apparatus for processing a substrate, comprising: a plurality of processing tanks configured to perform processing of the substrate; a transporter configured to transfer the substrate; and a controller configured to generate a transfer time table that causes the substrate to be transferred between the plurality of processing tanks and to be processed, and configured to control the transfer of the substrate by the transporter and the processing of the substrate in the plurality of processing tanks, based on the transfer time table, wherein the controller is configured to change over the transfer time table between an ordinary mode that has a maximum throughput of the apparatus for processing the substrate and a processing solution saving mode that saves a processing solution in at least one of the processing tanks, and wherein the controller determines whether or not the apparatus for processing the substrate is in a slack period that has a small demand output by the apparatus for processing the substrate, based on a rate-controlling point that limits a processing speed of the entire apparatus for processing the substrate, and sets the transfer time table to the processing solution saving mode when it is determined that the apparatus for processing the substrate is in the slack period, while setting the transfer time table to the ordinary mode when it is determined that the apparatus for processing the substrate is not in the slack period.

BRIEF DESCRIPTION OF DRAWINGS

FIG. 6 is a schematic diagram illustrating specific examples of input into and output from the transfer scheduler;

DESCRIPTION OF EMBODIMENTS

The following describes embodiments of the present disclosure with reference to drawings. In the respective embodiments described below, identical or equivalent members are expressed by identical reference signs with omission of duplicated description. In the description hereof, the expressions such as "upper" or "upward", "lower" or "downward", "left" or "leftward", and "right" or "rightward" are used. These expressions indicate the positions, the orientations, and the directions on the sheet surface of the illustrated drawings for the purpose of explanation, and these positions, orientations and directions may be different from those in the actual arrangement, for example, when using the apparatus.

Figure 1:
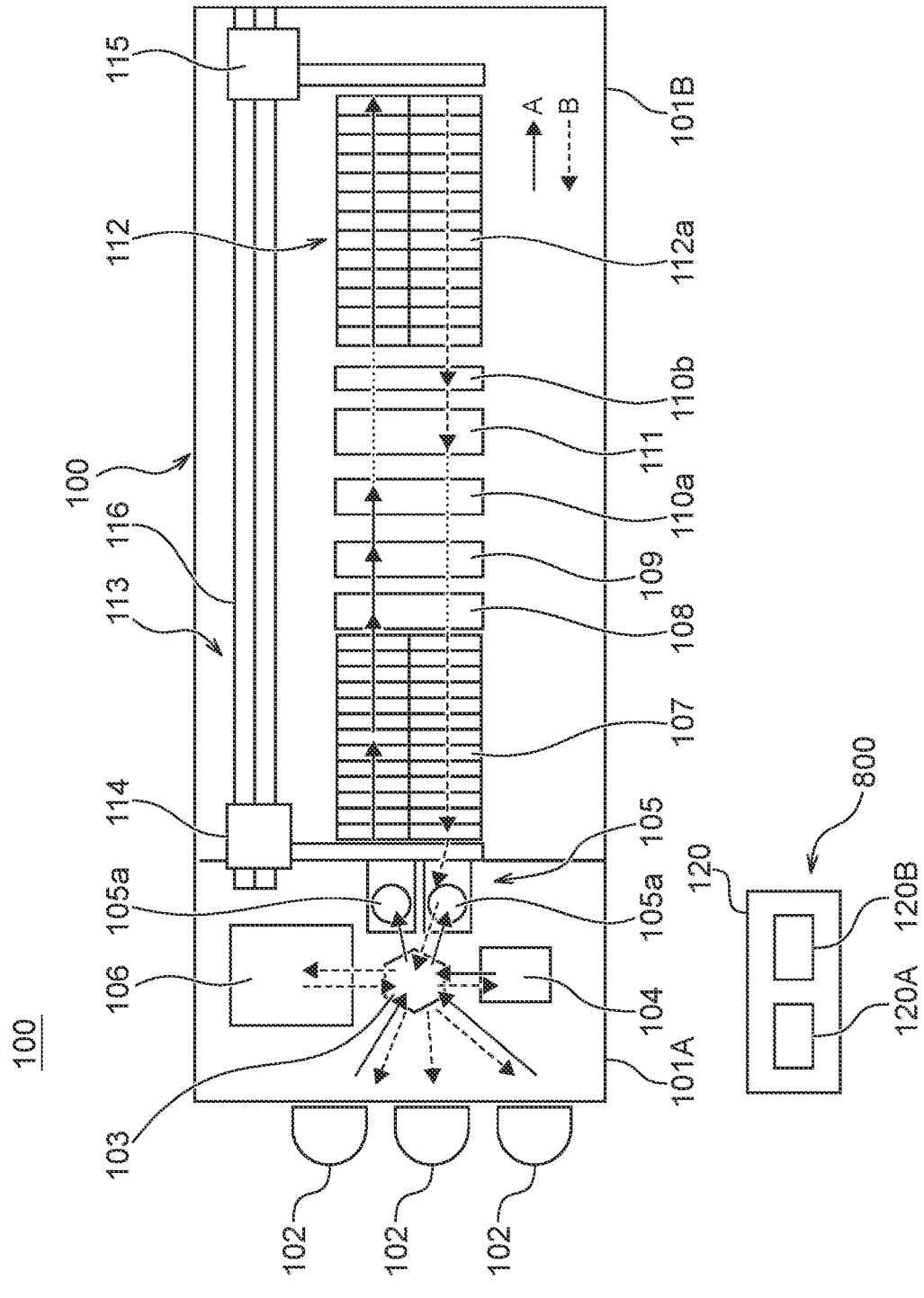
FIG. 1 is an overall arrangement drawing illustrating a substrate processing apparatus according to one embodiment.

FIG. 1 is an overall arrangement drawing illustrating a substrate processing apparatus according to one embodiment of the present disclosure. In this illustrated example, a substrate processing apparatus 100 is an electroplating apparatus. Although the following describes a dip-type electroplating apparatus as an example, the present disclosure is applicable to any substrate processing apparatuses including any plating apparatuses (for example, cup-type/face-down-type plating apparatuses and electroless plating apparatuses) that are allowed to save a processing solution by regulating a pull-out time of a substrate from a processing tank.

The substrate processing apparatus 100 is roughly divided into a loading/unloading station 101A configured to load a substrate, as an object to be processed, to a substrate holder (not shown) and to unload the substrate from the substrate holder; and a processing station 101B configured to process the substrate. The substrate includes substrates in circular shapes, substrates in polygonal shapes (such as rectangular shapes), and substrates in other arbitrary shapes. The substrate includes semiconductor wafers, glass substrates, liquid crystal substrates, printed circuit boards and other objects to be processed.

The loading/unloading station 101A includes a plurality of cassette tables 102, an aligner 104, a substrate mounting/demounting station 105, and a spin rinse dryer 106. A cassette (for example, an FOUP) with a substrate placed therein is mounted on each of the cassette tables 102. The aligner 104 is configured to adjust the position of an orientation flat or a notch of the substrate to a predetermined direction. The substrate mounting/demounting station 105 includes one or a plurality of substrate mounting/demounting devices 105a configured to mount and demount the substrate to and from the substrate holder. The spin rinse dryer 106 is configured to clean the substrate after a plating process and to rotate the cleaned substrate at a high speed and thereby dry the substrate. A transfer robot 103 is placed at the center of these units to transfer the substrate between these units.

The processing station 101B includes a stocker 107 configured to store and temporarily place the substrate holder, a pre-wet module 108, a pre-soak module 109, a pre-soak rinse module 110a, a blow module 111, a rinse module 110b, and a plating process module 112. The pre-wet module 108, the pre-soak module 109, the pre-soak rinse module 110a, the rinse module 110b, and the plating process module 112 may be collectively or individually called processing modules. Among the pre-wet module 108, the pre-soak module 109, the pre-soak rinse module 110a, the rinse module 110b, and the plating process module 112, part or a plurality of the processing modules may have a processing tank that holds a predetermined processing solution therein.

The pre-wet module 108 is configured to soak the substrate in a processing solution (for example, pure water) and to replace the air inside of an opening on the surface of the substrate, with the pure water. The pre-soak module 109 is configured to remove by etching, an oxidized film on the surface of a conductive layer such as a seed layer, formed on the surface of the substrate. The pre-soak rinse module 110a is configured to clean the substrate after the pre-soak process, along with the substrate holder, by using a cleaning solution (for example, pure water) as a processing solution. The blow module 111 is configured to drain the liquid from the substrate after cleaning. The rinse module 110b is configured to clean the substrate after plating, along with the substrate holder, by using a cleaning solution as a processing solution.

The plating process module 112 includes a plurality of cells (plating tanks 112a) with an overflow tank. Each of the plating tanks 112a has one substrate placed inside thereof and soaks the substrate in a plating solution kept inside thereof, so as to plate the surface of the substrate, for example, by copper plating. The type of the plating solution is not specifically limited, but various plating solutions may be used according to their uses and applications. In the case where one substrate is subjected to a plurality of different plating processes, the plating process module 112 includes a plurality of plating tanks 112a that respectively store different types of plating solutions.

The substrate processing apparatus 100 also includes a substrate holder transfer device 113 that employs, for example, a linear motor system and that is located on a lateral side of these respective devices and modules described above to transfer the substrate holder between these devices and modules. This substrate holder transfer device 113 includes a transporter (carrier machine) 114 and a transporter (carrier machine) 115. The transporter 114 and the transporter 115 travel on a rail 116. The transporter 114 transfers the substrate holder between the stocker 107, the substrate mounting/demounting station 105, the pre-wet module 108, the pre-soak module 109, the pre-soak rinse module 110a and the blow module 111. The transporter 115 transfers the substrate holder between the pre-soak rinse module 110a, the blow module 111, the rinse module 110b, and the plating process module 112. According to one modification, only one of the transporters 114 and 115 may be provided and used for transfer between the respective devices and modules described above. According to another modification, three or more transporters may be provided. The configuration of the substrate processing apparatus 100 described above is only one example, and the substrate processing apparatus 100 may employ another configuration.

In the substrate processing apparatus 100, the transfer robot 103 takes out an unprocessed substrate from a cassette mounted on each cassette table 102 and mounts the substrate on the aligner 104. The aligner 104 then positions the substrate by using the orientation flat or the notch as the reference. The transfer robot 103 subsequently transfers the substrate to the substrate mounting/demounting device 105a to mount the substrate to a substrate holder taken out from the stocker 107. In this illustrated example, a substrate is mounted to a substrate holder by each of the two substrate mounting/demounting devices 105a, and the two substrate holders are transferred as one set. The substrate mounted to the substrate holder is transferred by the transporter 114 to the pre-wet module 108 to be subjected to a pre-water washing process, is subsequently transferred to the pre-soak module 109 to be subjected to pre-treatment, and is further transferred to the pre-soak rinse module 110a to be subjected to a waster washing process.

The substrate water-washed by the pre-soak rinse module 110a is transferred by the transporter 115 to one of the plating tank 112a of the plating process module 112 to be soaked in the plating solution. The plating process is performed in the plating tank 112a to form a metal film on the substrate. In the case where multiple different types of plating processes are to be performed, the substrate is sequentially transferred to a plurality of plating tanks 112a to be subjected to the plating processes. The substrate after the plating process is transferred by the transporter 115 to the rinse module 110b to be subjected to a water washing process and is subsequently transferred to the blow module 111 to be subjected to a rough drying process. The substrate is then transferred by the transporter 114 to the substrate mounting/demounting station 105 to be demounted from the substrate holder. The substrate demounted from the substrate holder is transferred by the transfer robot 103 to the spin rinse dryer 106 to be subjected to a cleaning and drying process and is then placed in the cassette mounted on the cassette table 102.

Figure 2:
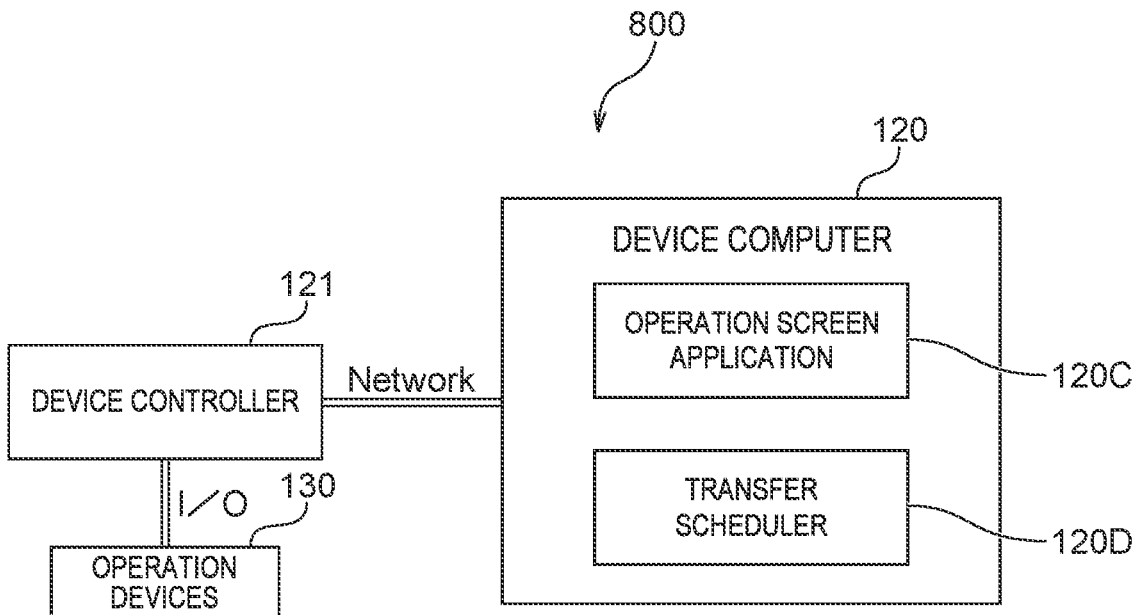
FIG. 2 is an explanatory diagram illustrating a control configuration of the substrate processing apparatus.

FIG. 2 is an explanatory diagram illustrating a control configuration of the substrate processing apparatus.

The substrate processing apparatus 100 includes a device computer 120 and a device controller 121 as a controller 800 configured to control the respective parts of the apparatus. The device computer 120 is connected with the device controller 121 by a wired network, by a wireless network, by a cable or the like. The device controller 121 is connected with various operation devices 130 of the substrate processing apparatus 100 via a predetermined interface I/O. The device computer 120 and the device controller 121 work in cooperation to perform controls of the various operation devices 130 of the substrate processing apparatus 100. Control signals from the device computer 120 are sent to the device controller 121 via the network, so as to control the various operation devices 130 via the device controller 121. The device computer 120 is configured to make wired or wireless communication with a non-illustrated upper level controller (host computer) that performs integrated control of the substrate control apparatus 100 and other relevant apparatuses and to send and receive data to and from a database of the upper level controller.

The device controller 121 is configured by, for example, a PLC or a sequencer to control the various operation devices of the substrate processing apparatus 100, based on control commands, set parameters, transfer time tables and the like from the device computer 120. The various operation devices of the substrate processing apparatus 100 include the transfer robot 103, the transporters 114 and 115, and other devices.

The device computer 120 includes a memory 120B configured to store various set data and various programs therein and a CPU 120A configured to perform the programs in the memory 120B. The device computer 120 may further be provided with an input output interface including an output device such as a display and an input device such as a keyboard and a mouse, although not being specifically illustrated. A storage medium configuring the memory 120B may include any volatile storage medium and/or any non-volatile storage medium. The storage medium may include one or a plurality of arbitrary storage media, for example, a ROM, a RAM, a hard disk, a CD-ROM, a DVD-ROM and a flexible disk.

The programs stored in the memory 120B include a software configuring an operation screen application 120B and a scheduling software configuring a module called a transfer scheduler 120D. The scheduling software is configured to calculate a substrate transfer time table. The CPU 120A executes the scheduling software to configure the transfer scheduler 120D. The operation screen application 120C causes, for example, substrate transfer time tables described later to be shown on a display. This operation screen application 120C enables an operator's inputs to be received and accepted. The transfer scheduler 120D serves as the substrate transfer controller and has a function of generating a transfer time table configured to perform transfer control that achieves a maximum throughput, based on, for example, predetermined operation time periods of the respective transporters (carrier machines) and the like, processing conditions (process recipe) of target substrates that are objects of processing commands, and the number of substrates to be processed (ordinary mode); and a function of generating a transfer time table configured to save the processing solution in one or a plurality of processing tanks (processing solution saving mode).

The programs stored in the memory 120B further include, for example, a program for performing control of mounting and demounting the substrate to and from the substrate holder in the substrate mounting/demounting station 105 and programs for performing controls of processes and treatments of the substrate in the respective processing modules and tanks (including a program for performing control of the plating process in the plating process module 112).

Figure 3:
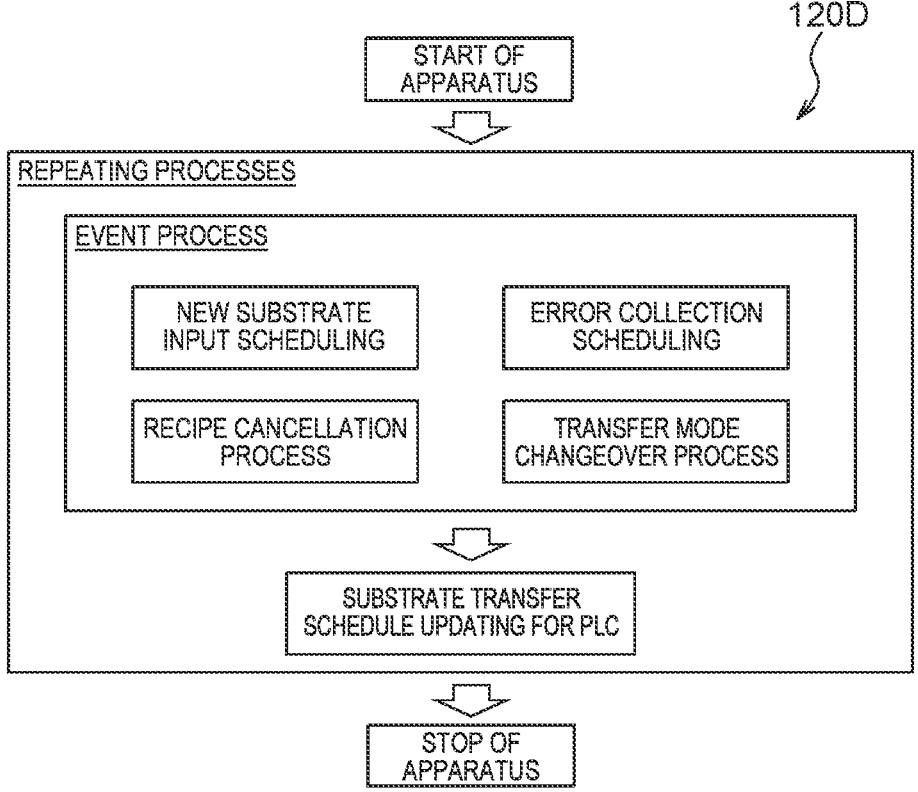
FIG. 3 is a schematic diagram illustrating a functional configuration of a transfer scheduler according to one embodiment.
Figure 4:
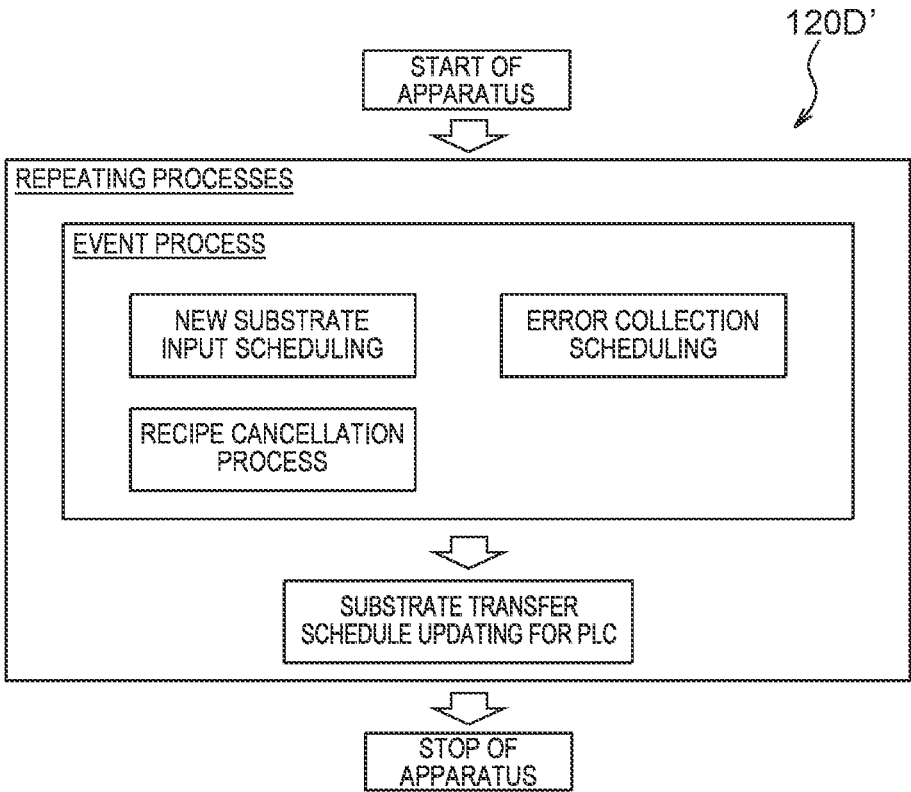
FIG. 4 is a schematic diagram illustrating a functional configuration of a transfer scheduler according to a comparative example.

FIG. 3 is a schematic diagram illustrating a functional configuration of the transfer scheduler 120D according to one embodiment. FIG. 4 is a schematic diagram illustrating a functional configuration of a transfer scheduler 120D' according to a comparative example.

In these drawings, both the transfer schedulers 120D and 120D' have event processing functions including a "new substrate input scheduling function", a "recipe cancellation process function" and an "error collection scheduling function", as well as a "substrate transfer schedule updating process for PLC", as functions of repeating processes that are performed after a start of the apparatus to a stop of the apparatus. The transfer scheduler 120D according to this embodiment is characterized by the presence of a "transfer mode changeover process function" to change over between the ordinary mode and the processing solution saving mode, compared with the transfer scheduler 120D' of the comparative example.

In response to issuance of a new substrate transfer job (hereinafter may simply be referred to as job), the transfer scheduler 120D calculates a transfer time table, based on, for example, the configuration of the substrate processing apparatus 100, the recipe, the operation time periods of the respective units (the processing tanks and the transporters (carrier machines)), and the time constraint. The substrate transfer job is assigned to one or a plurality of substrates. The transporters (carrier machines) transfer the substrate according to the transfer time table. On the occurrence of an event, such as an error-caused collection process or a job cancellation process, the transfer scheduler 120D updates the transfer time table to change transfer of subsequent substrates (non-stationary operation). The error-caused collection process is performed by the error collection scheduling function. The job cancellation process is performed by the recipe cancellation function. The transfer scheduler 120D is allowed to analyze the generated transfer time table and determine a throughput (number of substrates processed per unit time). The transfer scheduler 120D is also allowed to determine a rate-controlling point (point where the processing speed of the substrate processing apparatus 100 is limited) from the operation ratios of the respective units (the processing tanks and the transporters).

Figure 5:
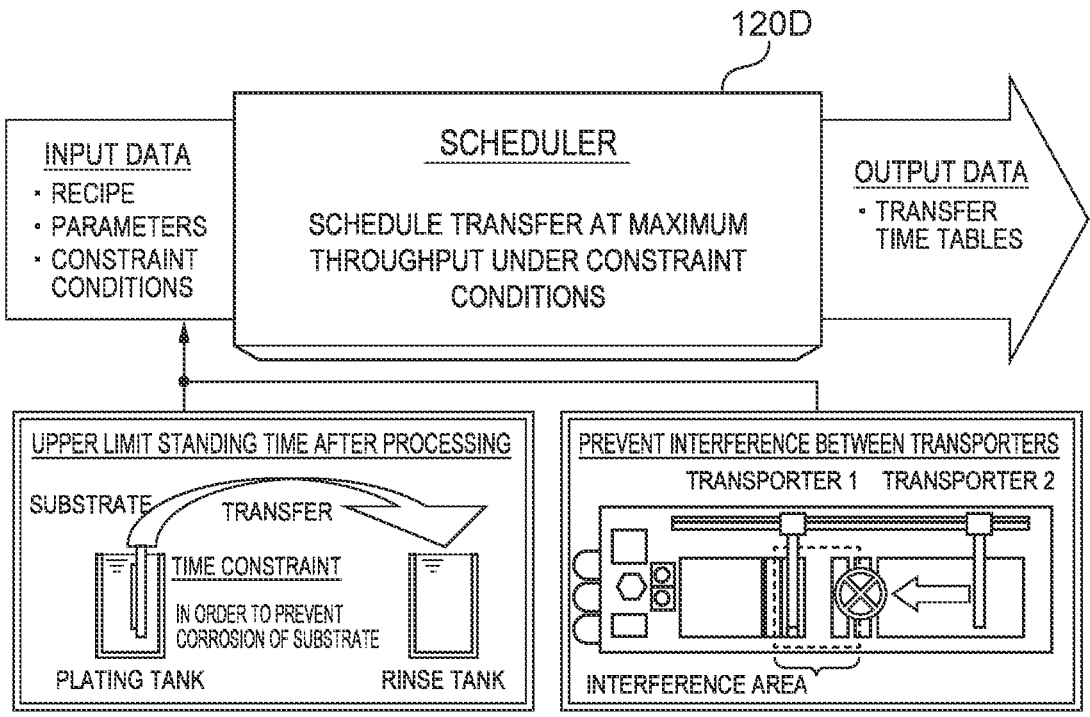
FIG. 5 is a schematic diagram illustrating primary functions of the transfer scheduler.

FIG. 5 is a schematic diagram illustrating primary functions of the transfer scheduler. FIG. 6 is a schematic diagram illustrating specific examples of input into and output from the transfer scheduler.

As shown in FIG. 5, the transfer scheduler 120D receives inputs of a recipe, parameters other than the recipe and constraint conditions as input data and generates a transfer time table at a maximum throughput under the constraint conditions. The constraint conditions include a standing time upper limit after the processing in each processing tank and an interference area or a buffer area provided for preventing a collision between the transporters. The standing time upper limit after the processing is a time constraint set to prevent corrosion of the substrate in each processing tank and is defined as a time period to carry out the substrate from the processing tank after completion of the processing in the processing tank. The interference area is an area set for preventing a collision between the transporters 114 and 115 and is set to prohibit the transporters from being moved to the interference area and to prevent the respective transporters from approaching to each other within a predetermined distance.

The recipe and the parameters other than the recipe are collectively referred to as input parameters in FIG. 6. As shown in FIG. 6, a recipe includes, for example, a processing order and a processing time that are set for each substrate or for each job assigned to one or a plurality of substrates. The parameters other than the recipe include, for example, "set parameters of the apparatus", "set parameters of the processing module and tanks" and "set parameters of the transporters". The set parameters of the apparatus include parameters, for example, use/unuse of the respective tanks, the number of tanks, and the number of substrate holders. The set parameters of the processing module and tanks include, for example, operation times of various mechanisms included in the processing module and tanks, a pre-processing time/post-processing time, and a reset time. The pre-processing time denotes a time period required to start processing after the substrate is carried into the tank. The post-processing time denotes a time period required to carry out the substrate after the processing of the substrate in the tank. The reset time denotes a time period required to make a tank ready again after the substrate is carried out from the tank. The set parameters of the transporters include, for example, a moving time and taking out/placing times. The configuration of the input parameters is only one example and may be changed appropriately according to the configurations of the apparatus and the process.

As shown in FIG. 6, the transfer time table generated by the transfer scheduler 120D includes a start time, transporters as operation objects, types of operations (taking out/placing), source processing module and tanks and destination processing module and tanks. The configuration of the transfer time table shown in FIG. 6 is only one example and may be changed appropriately according to the configurations of the apparatus and the process.

Figure 7:
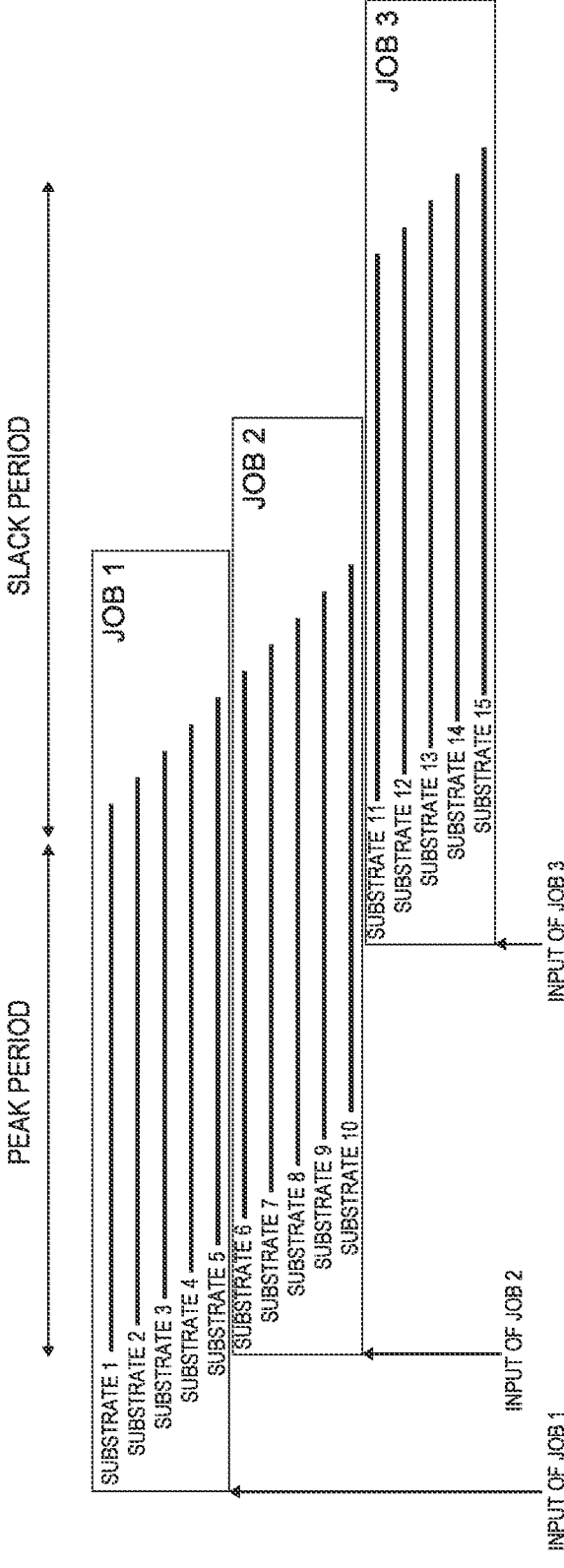
FIG. 7 is a time chart illustrating the concept of a peak period and a slack period of the substrate processing apparatus.

FIG. 7 is a time chart illustrating the concept of a peak period and a slack period of the substrate processing apparatus.

In this time chart, a job denotes an operation unit which one or a plurality of substrates are assigned to. In this illustrated example, five substrates are assigned to one job: substrates 1 to 5 are assigned to a job 1; substrates 6 to 10 are assigned to a job 2; and substrates 11 to 15 are assigned to a job 3. A line segment drawn on the side of each substrate name schematically illustrates a transfer time table of the substrate. A starting point of each line segment denotes a timing (time, time point) when each substrate is taken out from a cassette by the transfer robot 103 to be processed by the substrate processing apparatus 100. A terminal point of each line segment denotes a timing when each substrate is placed into a cassette by the transfer robot 103 after the processing by the substrate processing apparatus 100. In the description below, taking out each substrate from a cassette by the transfer robot 103 to be processed by the substrate processing apparatus 100 is referred to as supplying each substrate to the apparatus.

In the illustrated example, after the first substrate 1 of the job 1 is supplied to the apparatus, the substrate 2, the substrate 3, the substrate 4, and the substrate 5 are sequentially supplied to the apparatus at short time intervals. After the last substrate 5 of the job 1 is supplied to the apparatus, the first substrate 6 of the job 2 is supplied to the apparatus at a short time interval (first time interval). The substrate 7, the substrate 8, the substrate 9, and the substrate 10 are then sequentially supplied to the apparatus at short time intervals. The supply of substrates of the job 3 is started at a longer time interval (second time interval) than the time interval (first time interval) between the supply of substrates of the job 1 and the supply of substrates of the job 2.

It is understood that starting the supply of the substrate 11 of the job 3 to the apparatus at a shorter time interval after the supply of the job 2 further improves the throughput. In other words, the longer time interval after the supply of the job 2 causes the throughput to peak out in the supply period of the job 3. The throughput increases with an increase in the supply of substrates to the apparatus (i.e., with a decrease in the interval of the supply of substrates to the apparatus). A rate-controlling point (bottleneck) where the processing speed of the substrate processing apparatus 100 is limited is "supply of substrates to the apparatus". After the start timing of the supply of substrates of the job 3 (after the timing of supply of the substrate 11), the "supply of substrates to the apparatus" is the rate-controlling point. This period is a time period having a small demand output and is defined as a "slack period". Increasing the supply of substrates to the apparatus means shortening the interval of the supply of substrates to the apparatus.

During the supply of substrates of the job 1 and of the job 2 to the apparatus, on the other hand, the substrates are supplied to the apparatus at sufficiently short time intervals. It is accordingly impossible to further increase the supply of substrates to the apparatus due to the reason on the apparatus side (or increasing the supply of substrates to the apparatus does not increase the throughput). The rate-controlling point of the substrate processing apparatus 100 is not the supply of substrates to the apparatus (the rate-controlling point is any of the plurality of transporters or any of the plurality of processing tanks). This period is a time period having a sufficiently short interval of the supply of substrates to the apparatus and having a large demand output and is defined as a "peak period".

The configuration of the embodiment analyzes the generated transfer time table and determines that the substrate processing apparatus 100 is in a slack period (is during a slack period) when the throughput increases with an increase in the supply of substrates to the apparatus (i.e., when the supply of substrates to the apparatus is the rate-controlling point), while determining that the substrate processing apparatus 100 is in a peak period (is during a peak period) when it is impossible to increase the supply of substrates to the apparatus due to the reason on the apparatus side or when increasing the supply of substrates to the apparatus does not increase the throughput (i.e., when the supply of substrates to the apparatus is not the rate-controlling point). It is assumed herein that the time period of not the peak period means the slack period and that the time period of not the slack period means the peak period.

The rate-controlling point may be determined, based on the operation ratios (ratio of an operation time to a predetermined time period) of the respective transporters (carrier machines 114 and 115) and the respective processing tanks. In the case where increasing the supply of substrates to the apparatus and increasing the operation ratios increase the throughput, it is determined that the rate-controlling point is the supply of substrates to the apparatus (slack period). In the case where it is impossible to increase the supply of substrates to the apparatus due to the reason on the apparatus side or increasing the supply of substrates to the apparatus does not increase the throughput, it is determined that the rate controlling point is not the supply of substrates to the apparatus (peak period).

For example, one available configuration may set a reference value of the operation ratio with regard to each of the transporters and the processing tanks, compare an operation ratio in a current transfer time table with the reference value with regard to each of the transporters (carrier machines) and the processing tanks, and determine that it is impossible to further increase the operation ratio of the transporter or the processing tank when the operation ratio is equal to or higher than the reference value. The configuration may determine that the apparatus is in a slack period in the case where the throughput is increased by increasing the operation ratio of part of the transporters or part of the processing tanks and increasing the supply of substrates, while otherwise determining that the apparatus is in a peak period.

Another configuration may determine whether the apparatus is in a slack period or in a peak period by taking into account the number of substrates present in the substrate processing apparatus and the presence or the absence or the number of subsequent jobs to be processed in the substrate processing apparatus. More specifically, even in the case where the supply of substrates to the apparatus is determined to be the rate-controlling point, when the number of substrates present in the substrate processing apparatus and the presence or the absence or the number of subsequent jobs to be processed in the substrate processing apparatus meet predetermined conditions, the configuration may determine that the apparatus is not in a slack period but is in a peak period. In other words, even in the case where the supply of substrates is the rate-controlling point, when the number of substrates present in the substrate processing apparatus is larger than a predetermined reference value and/or the number of subsequent jobs is larger than a predetermined reference value, this configuration may not determine that the apparatus is in a slack period with giving priority to the throughput.

When the apparatus is determined to be in a slack period, the configuration of the embodiment elongates a pull-out time of each substrate from one or a plurality of processing tanks by a transporter or by a lifting mechanism (reduces a pull-out speed of the substrate in the tank by the transporter or by the lifting mechanism and/or elongates a waiting time of the substrate after the pull-out in the processing tank) in the processing solution saving mode. This increases the amount of the processing solution returned to the processing tank, reduces the drag-out amount of the processing solution by the substrate (the substrate and/or the substrate holder), and saves the processing solution. The waiting time of the substrate after the pull-out in the processing tank is included in the operation time of the transporter.

In the slack period (in the processing solution saving mode), the pull-out time of each substrate from one or a plurality of processing tanks may be elongated with an increase in the input interval of the job. The pull-out time of each substrate may be elongated only during a predetermined fixed time period. In the slack period, the "supply of substrates to the apparatus" is the rate-controlling point. As the pull-out time by a transporter is elongated, however, the rate-controlling point is shifted to the "transporter" at the time when the elongated pull-out time exceeds a predetermined reference value. The configuration of the embodiment analyzes the transfer time table generated in the mode at the time of the job input and determines whether the apparatus is in a slack period or in a peak period, based on whether the "supply of substrates to the apparatus" is the rate-controlling point. In order to prevent a false recognition that the apparatus is in a peak period due to a shift of the rate-controlling point to the "transporter", the pull-out time of the substrate is elongated in such a range that the rate-controlling point is kept to the "supply of substrates to the apparatus". Elongation of the pull-out time of the substrate from the processing tank increases the operation ratios of the transporters (carrier machines) 114 and 115, while reducing the allowance. The pull-out time of the substrate is allowed to be elongated in the range that the rate-controlling point is kept to the "supply of substrates to the apparatus". In other words, the relationship of an expression given below is to be maintained, with a view to preventing the rate-controlling point from shifting to the transporters 114 and 115 by elongation of the pull-out time:

Throughput at the rate-controlling point that is the "supply of substrates to the apparatus">Throughput at the rate-controlling point that is the "transporter".

In general, there is no frequent changeover between the peak period and the slack period. A configuration of generating the transfer time table in a mode set at the time of the job input and analyzing the generated transfer time table to determine whether the apparatus is in a slack period or not reduces the frequency of updating the transfer time table caused by the changeover of the mode. A configuration of limiting the elongation of the pull-out time of the substrate to a range that the rate-controlling point is kept to the "supply of substrates to the apparatus" elongates the pull-out time of the substrate in the processing tank and enables the processing solution to be returned to the processing tank, while suppressing an excessive decrease in the throughput.

The configuration of the embodiment is allowed to elongate the pull-out time of the substrate from the processing tank and to generate a transfer time table at a throughput lower than the maximum throughput, as long as the rate-controlling point is the "supply of substrates to the apparatus" in the slack period (in the processing solution saving mode). This effectively saves the processing solution in the slack period when the priority is given to saving of the processing solution over the throughput.

Figure 8:
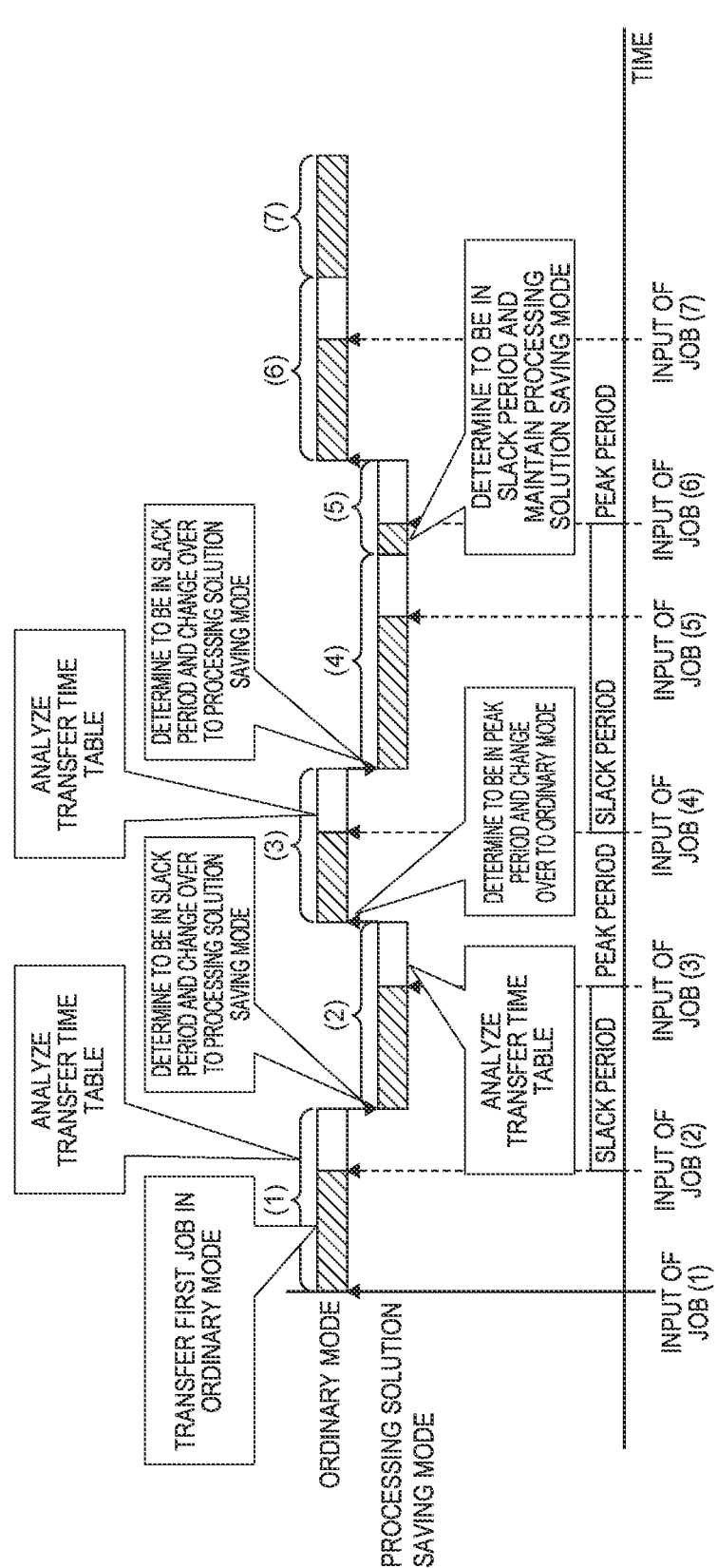
FIG. 8 is a time chart illustrating changeover between an ordinary mode and a processing solution saving mode.

FIG. 8 is a time chart illustrating changeover between the ordinary mode and the processing solution saving mode.

According to the embodiment, the transfer scheduler 120D is configured to set a transfer time table in the "peak period" to the "ordinary mode" and to set a transfer time table in the "slack period" to the "processing solution saving mode". In the ordinary mode, the transfer scheduler 120D generates a transfer time table such as to have a maximum throughput. In the processing solution saving mode, the transfer scheduler 120D reduces the pull-out speed of the substrate and/or elongates the waiting time in the processing tank after the pull-out of the substrate, so as to elongate the "pull-out time" assigned to the pull-out of the substrate. This increases the amount of the processing solution returned to the processing tank, reduces the drag-out amount of the processing solution by the substrate (the substrate and/or the substrate holder), and saves the processing solution.

Each band in FIG. 8 schematically represents a transfer time table, and each numeral attached to each band represents a job number. For example, a band with a numeral (1) attached thereto represents a transfer time table of a first job. As a matter of convenience, a next job is started after completion of a preceding job in this time chart. The transfer time tables of the respective jobs may, however, be partly overlapped as shown in FIG. 7. In FIG. 8, a "job input" indicates a timing when the transfer scheduler 120D receives an event of a new job. After a transfer time table of the new job is generated by the transfer scheduler 120D, a substrate or substrates of the new job are supplied to the apparatus. Each job include one or a plurality of substrates.

In the illustrated example of FIG. 8, a transfer time table in the ordinary mode is generated with regard to a first job (substrate(s)), and the first job is transferred in the substrate processing apparatus 100 to be processed according to the transfer time table in the ordinary mode (the band of the numeral (1)). When a second job is input during the transfer of the first job, a transfer time table is generated in the ordinary mode that has been set at the time of the input of the second job and is analyzed. When the apparatus is determined to be in a slack period as a result of the analysis, the transfer time table is updated to a transfer time table in the processing solution saving mode (i.e., the mode is changed over to the processing solution saving model). The substrates of non-transferred part of the first job and of the second job are transferred to be processed according to the transfer time table in the processing solution saving mode (the band of the numeral (2)). In FIG. 8, the transfer time table generated at the time of the input of the second job includes the transfer time table with regard to the second job and the transfer time table with regard to the non-transferred part of the first job. With regard to each of subsequent jobs, it is similarly determined whether the apparatus is in a peak period or in a slack period, and substrates are transferred to be processed according to a transfer time table in the ordinary mode or in the processing solution saving mode. For example, when a fifth job is input during transfer of a fourth job, a transfer time table is generated in the processing solution saving mode that has been set at the time of the input of the fifth job and is analyzed. When the apparatus is determined to be in a slack period again as a result of the analysis, the generated transfer time table is used (i.e., the mode is kept to the processing solution saving mode), and the substrates of non-transferred part of the preceding jobs (the first to the fourth jobs) and of the fifth job are transferred to be processed according to the transfer time table in the processing solution saving mode (the band of the numeral (5)). In this illustrated example, at the time of input of a new job, the transfer time table is updated with regard to non-transferred part of any preceding job. A modified configuration may not update the transfer time table but may use the generated transfer time table with regard to the non-transferred part of any preceding job.

This embodiment illustrates the configuration of generating a transfer time table in a mode that has been set at the time of input of a job, and analyzing the generated transfer time table and determining whether the apparatus is in a slack period or not. A modified configuration may always generate a transfer time table in the ordinary mode at the time of input of a job, analyze the generated transfer time table and determine whether the apparatus is in a slack period or not. Since this modified configuration always analyzes the transfer time table in the ordinary mode and determines whether the apparatus in a slack period or not, there is no need to limit the elongation of the pull-out time of the substrate to the range that the rate-controlling point is kept to the "supply of substrates to the apparatus" in the transfer time table in the processing solution saving mode. The configuration of limiting the elongation of the pull-out time of the substrate to a range that the rate-controlling point is kept to the "supply of substrates to the apparatus", however, elongates the pull-out time of the substrate in the processing tank and enables the processing solution to be returned to the processing tank, while suppressing an excessive decrease in the throughput.

Figure 9:
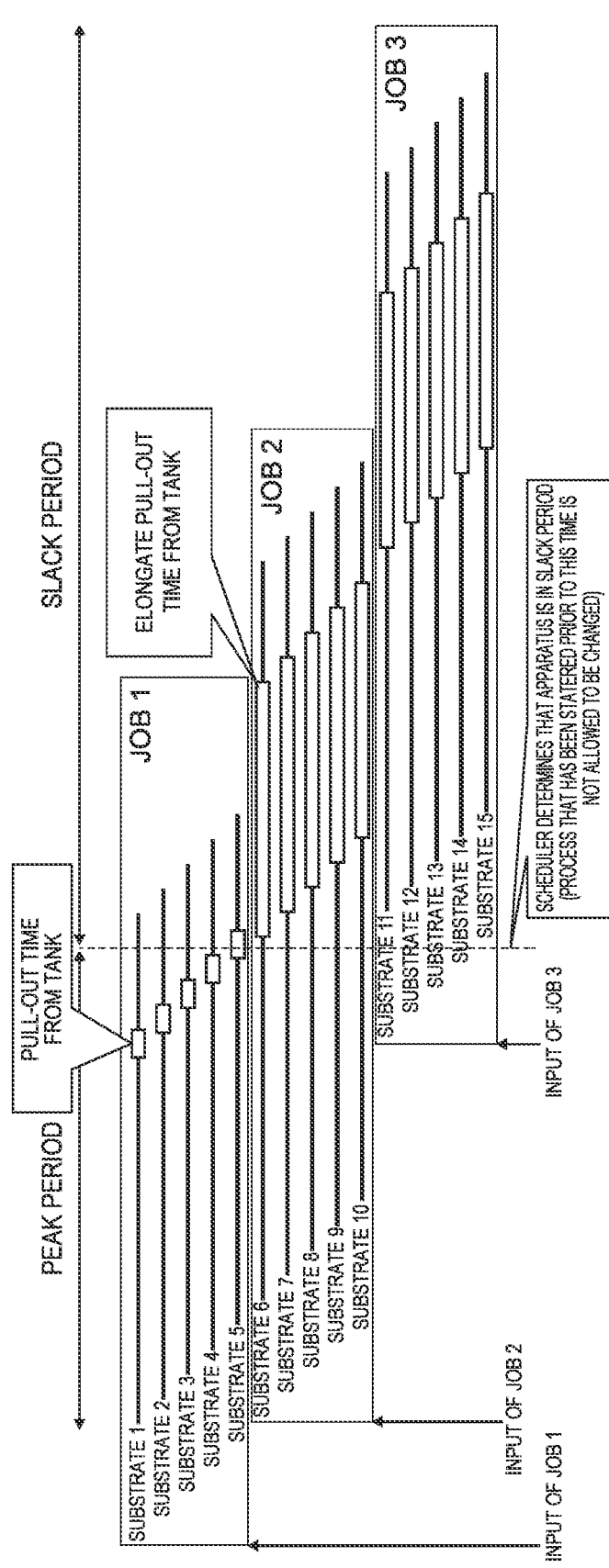
FIG. 9 is a time chart illustrating changeover to the processing solution saving mode.

FIG. 9 is a time chart illustrating changeover to the processing solution saving mode.

FIG. 9 illustrates jobs 1 to 3 similar to those of FIG. 7 and further include thick line portions in the middle of the line segments of the transfer time tables assigned to the respective substrates. Each thick line portion schematically illustrates a pull-out time of the substrate from the processing tank. There is only one thick line portion provided for the line segment of the transfer time table with regard to each substrate. This thick line portion shows a representative value of the pull-out time of the substrate(s) in one or a plurality of processing tanks.

At the time of input of the job 1 and at the time of input of the job 2, the substrate processing apparatus 100 is in a peak period. Transfer time tables in the ordinary mode are accordingly generated with regard to the job 1 and the job 2, and the process of transferring and processing the respective substrates of the job 1 and of the job 2 is started in the substrate processing apparatus 100 according to the transfer time tables in the ordinary mode. When it is subsequently determined that the substrate processing apparatus 100 is in a slack period at the time of input of the job 3, the transfer time table is changed over to the processing solution saving mode at this timing. Transfer substrate tables in the processing solution saving mode (transfer time tables with regard to the jobs 1 to 3) are then generated to elongate the pull-out time of the substrate in processing tanks corresponding to non-started processes. With regard to the respective substrates of the job 1, there is no processing tank corresponding to any non-started process, so that the transfer time table in the ordinary mode is kept in use. With regard to the respective substrates of the job 2, on the other hand, there are processing tanks corresponding to non-started processes. The transfer time table is accordingly corrected and updated to elongate the pull-out time of the substrate in the corresponding processing tanks. With regard to the job 2, however, part of the transfer time table for process-started processing tanks is not allowed to be changed. With regard to the the the job 3, the transfer time table in the processing solution saving mode is generated to elongate the pull-out time of the substrate in one or a plurality of processing tanks.

As a result, with regard to the job 2 and the job 3, this elongates the pull-out time of the substrates in one or a plurality of processing tanks and reduces the drag-out amount of the processing solution. As clearly understood from comparison between the transfer time table of the job 2 in FIG. 7 and the transfer time table of the job 2 in FIG. 9, the longer time is allocated to the transfer time table of the job 2 changed over to the processing solution saving mode (FIG. 9), compared with the time allocated to the transfer time table of the job 2 set to have the maximum throughput (FIG. 7). In other words, the transfer time table of the job 2 in FIG. 9 has the longer time period required for the job 2, compared with the transfer time table of the job 2 (at the maximum throughput) in FIG. 7. The same applies to the transfer time table of the job 3. The processing solution saving mode gives priority to saving of the processing solution over the throughput in this manner, so as to elongate the pull-out time of the substrate and save the processing solution. The slack period originally has a small supply of substrates. Elongating the pull-out time of the substrate in the range that the rate-controlling point is kept to the "supply of substrates to the apparatus" successfully saves the processing solution without excessively decreasing the throughput.

Figure 10A:
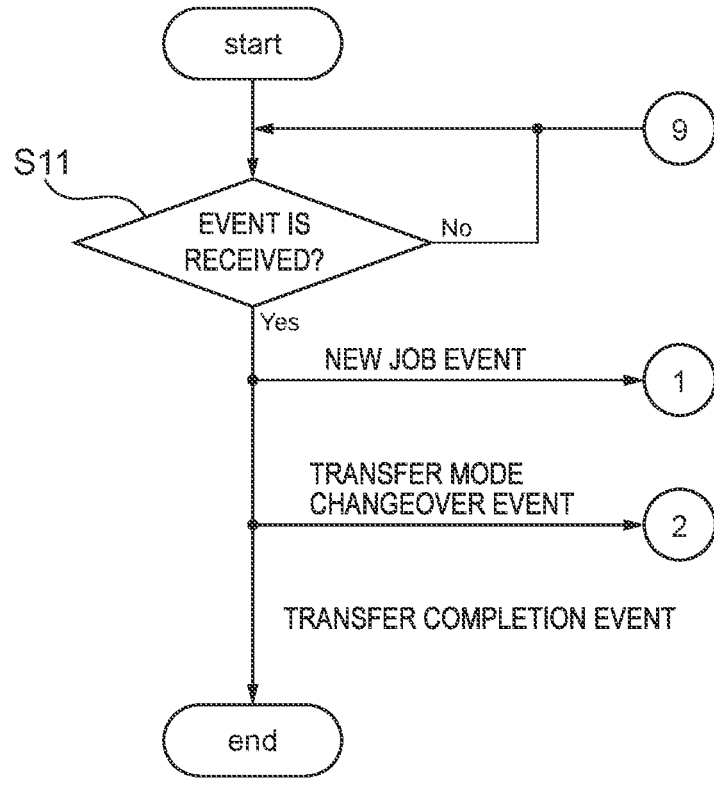
FIG. 10A is a flowchart showing a transfer scheduling.
Figure 10B:
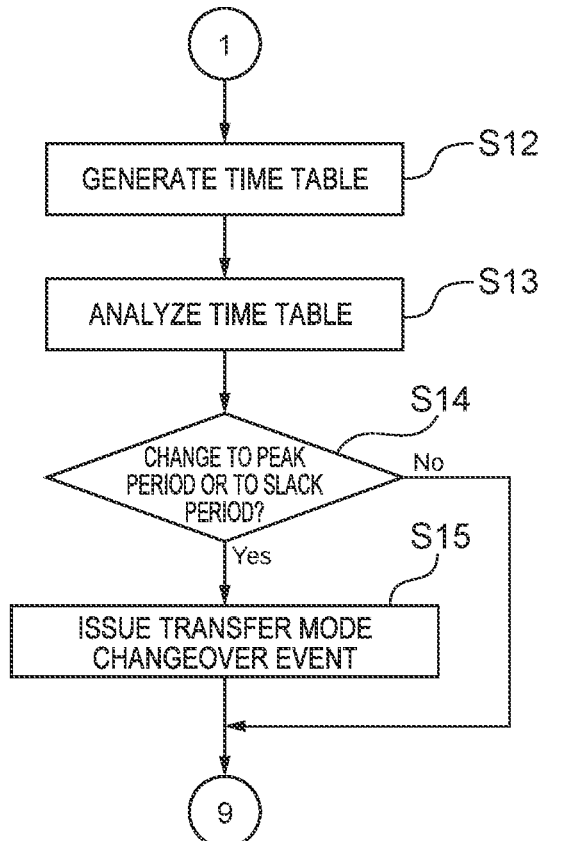
FIG. 10B is a flowchart showing the transfer scheduling.
Figure 10C:
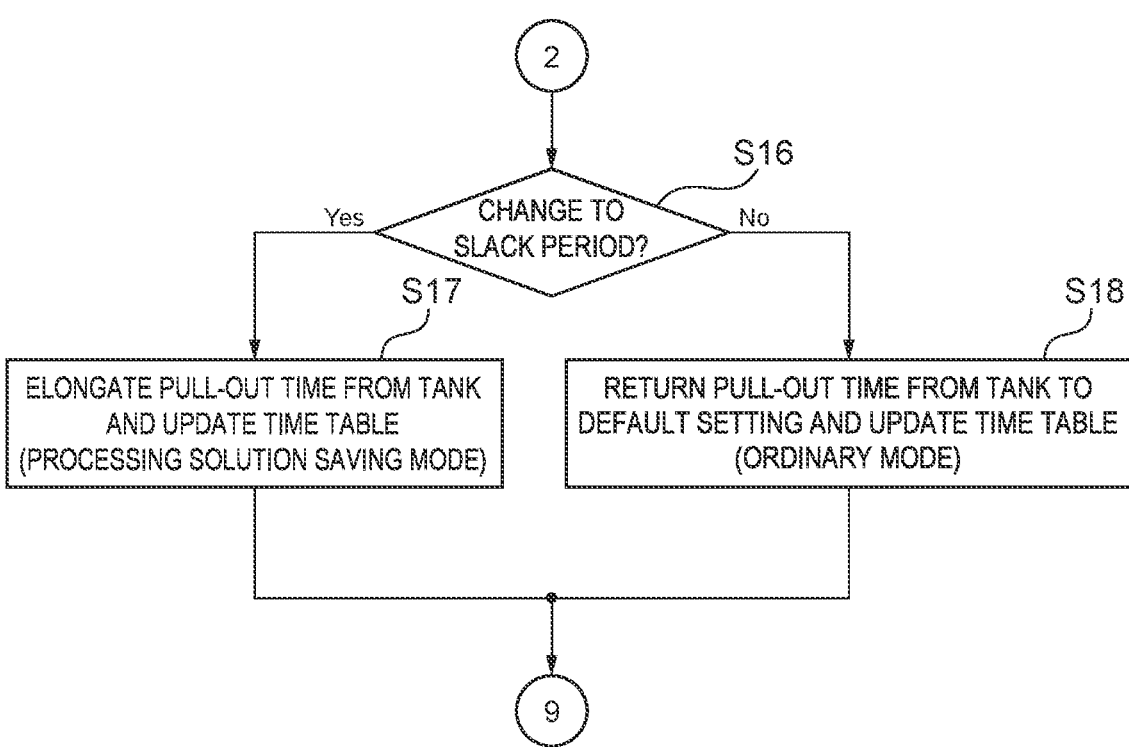
FIG. 10C is a flowchart showing the transfer scheduling.

FIG. 10A to 10C are flowcharts showing transfer scheduling. This process is performed by the transfer scheduler 120D (the controller 800).

At step S11, the transfer scheduler 120D determines whether an event (a new job event, a transfer mode changeover event, a transfer completion event) is received and identifies the type of the event when the event is received. The transfer scheduler 120D proceeds to step S12 or to step S16 or terminates the processing (end) according to the identified type of the event. When no event is received (in the case of a negative answer "No" at step S11), the transfer scheduler 120D repeats the processing of step S11.

When it is determined at step S11 that a new job event is received, the transfer scheduler 120D proceeds to step S12. At step S12, the transfer scheduler 120D generates a transfer time table with regard to a new job. The mode of the transfer time table to be generated is the mode that has been set at the time of input of the new job. More specifically, the transfer scheduler 120D identifies the mode/period (the processing solution saving mode/the slack period, or the ordinary mode/the peak period) set at the time of input of the job and generates a transfer time table in the processing solution saving mode when the apparatus is in the slack period, while generating a transfer time table in the ordinary mode when the apparatus is in the peak period.

At step S13, the transfer scheduler 120D analyzes the generated transfer time table, determines whether the substrate processing apparatus 100 is in a peak period or in a slack period, and subsequently proceeds to step S14. Concretely, the transfer scheduler 120D analyzes the generated transfer time table to calculate the operation ratios of the respective transporters and of the respective processing tanks, and determines whether the supply of substrates to the apparatus is the rate-controlling point of the throughput, based on the operation ratios of the respective transporters and of the respective processing tanks. When the supply of substrate is the rate-controlling point, the transfer scheduler 120D determines that the substrate processing apparatus 100 is in a slack period. When the supply of substrates is not the rate-controlling point, on the other hand, the transfer scheduler 120D determines that the substrate processing apparatus 100 is in a peak period. More specifically, the transfer scheduler 120D calculates the operation ratios of the respective transporters and of the respective processing tanks. Based on the operation ratios of the respective transporters and of the respective processing tanks, when increasing the supply of substrates to the apparatus (and increasing the operation ratios) enhances the throughput, the transfer scheduler 120D determines that the supply of substrates to the apparatus is the rate-controlling point and determines that the substrate processing apparatus 100 is in a slack period. When it is impossible to increase the supply of substrates to the apparatus (or increasing the supply of substrates to the apparatus does not enhance the throughput), on the other hand, the transfer scheduler 120D determines that the supply of substrates to the apparatus is not the rate-controlling point and determines that the substrate processing apparatus 100 is in a peak period.

At step S14, the transfer scheduler 120D determines whether there is a change to the peak period or to the slack period. More specifically, the transfer scheduler 120D determines whether there is a change from the peak period to the slack period or there is a change from the slack period to the peak period. Concretely, the transfer scheduler 120D compares data of the peak period/the slack period set at the time when the new job event is received, with the result of the analysis (the peak period/the slack period) at step S13 to determine whether there is a change or not. The default setting (initial setting) is the "peak period" at the time when a first job event is received. When the result of the determination indicates no change, the transfer scheduler 120D returns to step S11 to wait for receiving a next event. When the result of the determination indicates a change to the peak period or to the slack period, on the other hand, the transfer scheduler 120D issues a transfer mode changeover event (step S15), detects the transfer mode changeover event at step S11 and proceeds to step S16.

At step S16, the transfer scheduler 120D determines whether or not there is a change to the slack period. When it is determined that there is a change to the slack period, the transfer scheduler 120D proceeds to step S17. When it is determined at step S16 that there is not a change to the slack period (but there is a change to the peak period), on the other hand, the transfer scheduler 120D proceeds to step S18.

At step S17, the transfer scheduler 120D changes over the transfer mode from the ordinary mode to the processing solution saving mode, elongates the pull-out time from any processing tank where the processing has not yet been started (more specifically, processing tanks where the processing has not yet been started with regard to a preceding job (or preceding jobs) and processing tanks included in the transfer time table of the new job), with regard to the respective substrates of each job, and updates the transfer time table. The transfer scheduler 120D then returns to step S11 to wait for receiving a next event. The pull-out time is elongated by increasing the pull-out speed of the substrate and/or by elongating the waiting time of the substrate after the pull-out in any target processing tank.

The transfer scheduler 120D may calculate the operation ratios of the processing tanks and of the transporters 114 and 115 configured to transfer the substrates to the processing tanks and may set the range of elongation of the pull-out time of the substrates according to these operation ratios. More specifically, at the lower operation ratios, the pull-out time of the substrate from one or a plurality of processing tanks is more elongated. Increasing the pull-out time of the substrates decreases the drag-out amount of the processing solution (the drawing amount of the processing solution) and increases the saving amount of the processing solution.

At step S18, the transfer scheduler 120D changes over the transfer mode from the processing solution saving mode to the ordinary mode, returns the pull-out time to the default setting (the pull-out time before the elongation) in the processing tanks where the processing has not yet been started in a preceding job (or preceding jobs), with regard to the respective substrates of each job, and changes the transfer time table corresponding to the new job to the transfer time table in the ordinary mode, so as to update the transfer time table. The transfer scheduler 120D subsequently returns to step S11 to wait for receiving a next event.

The device controller 121 sequentially transfers the substrates of each job and processes the substrates of each job in the respective processing tanks, based on the transfer time table that is occasionally changed over to the ordinary mode or to the processing solution saving mode to be updated as described above. The transfer and the processing of the substrates is performed in parallel with the transfer scheduling (shown in FIGS. 10A to 10C). When detecting the transfer completion event (that transfer of all the substrates is completed and there is no more substrate in the apparatus) at step S11, the transfer scheduler 120D terminates the processing.

OTHER EMBODIMENTS (1) The configuration of the above embodiment determines whether or not the rate-controlling point is the supply of substrates to the apparatus, based on the operation ratios of the transporters and of the processing tanks, and determines whether the substrate processing apparatus is in the slack period (or in the peak period). A modified configuration may determine whether the substrate processing apparatus is in the slack period (or in the peak period), based on the number of substrates present in the substrate processing apparatus and the presence or the absence or the number of subsequent jobs to be processed in the substrate processing apparatus. In other words, the modified configuration may indirectly determine whether or not the rate-controlling point is the supply of substrates to the apparatus, based on the number of substrates present in the substrate processing apparatus and the presence or the absence or the number of subsequent jobs to be processed in the substrate processing apparatus. For example, the modified configuration may set a reference value of the number of substrates present in the substrate processing apparatus and a reference value of the number of subsequent jobs to be processed in the substrate processing apparatus (the reference value=0 in the case of the presence or the absence of any subsequent jobs) as threshold values for determining that the substrate processing apparatus is in the slack period, and may determine that the substrate processing apparatus is in the slack period when either one or both of the number of substrates and the number of subsequent jobs become equal to or smaller than the respective reference values. This modified configuration allows for the determination of whether or not the substrate processing apparatus is in the slack period by the simple processing. This modified configuration does not need to limit the elongation of the pull-out time of the substrate to the range that the rate-controlling point is kept to the "supply of substrates to the apparatus" in the transfer time table in the processing solution saving mode. The configuration of limiting the elongation of the pull-out time of the substrate to a range that the rate-controlling point is kept to the "supply of substrates to the apparatus", however, elongates the pull-out time of the substrate in the processing tank and enables the processing solution to be returned to the processing tank, while suppressing an excessive decrease in the throughput.

At least the following aspects are provided as technical ideas from the above description of the embodiments.

[1] According to one aspect, there is provided an apparatus for processing a substrate, comprising: a plurality of processing tanks configured to perform processing of the substrate; a transporter configured to transfer the substrate; and a controller control device configured to generate a transfer time table that causes the substrate to be transferred between the plurality of processing tanks and to be processed, and configured to control the transfer of the substrate by the transporter and the processing of the substrate in the plurality of processing tanks, based on the transfer time table, wherein the controller is configured to change over the transfer time table between an ordinary mode that has a maximum throughput of the apparatus for processing the substrate and a processing solution saving mode that saves a processing solution in at least one of the processing tanks, and wherein the controller determines whether or not the apparatus for processing the substrate is in a slack period that has a small demand output by the apparatus for processing the substrate, based on a rate-controlling point that limits a processing speed of the entire apparatus for processing the substrate, and sets the transfer time table to the processing solution saving mode when it is determined that the apparatus for processing the substrate is in the slack period, while setting the transfer time table to the ordinary mode when it is determined that the apparatus for processing the substrate is not in the slack period.

The "slack period" having the small demand output is a time period when the supply of the substrate to the apparatus for processing the substrate (the interval of the supply of the substrate) is a rate-controlling point that limits the processing speed of the entire apparatus for processing the substrate. A "peak period" that is other than the slack period is a time period when the supply of the substrate to the apparatus for processing the substrate (the interval of the supply of the substrate) is not the rate-controlling point that limits the processing speed of the entire apparatus for processing the substrate.

In the processing solution saving mode during the "slack period" that is other than the peak period, the transfer time table is generated to elongate the pull-out time of the substrate in the processing tank and to allow for a throughput that is lower than the maximum throughput. This configuration enables a larger amount of the processing solution (plating solution) adhering to the substrate and/or a substrate holder to be returned to the processing tank. With a view to suppressing a decrease in the throughput, the elongation of the pull-out time of the substrate may be limited in such a range that the rate-controlling point is kept to the "supply of the substrate to the apparatus".

According to the configuration of this aspect, the controller of the apparatus for processing the substrate determines that the apparatus is in the slack period, based on the rate-controlling point and automatically generates the transfer time table in the processing solution saving mode. This configuration does not require the operator to determine adjustment of parameters and/or make an inquiry to a development team and enables the apparatus for processing the substrate to flexibly and promptly have the setting that saves the processing solution. Furthermore, the apparatus for processing the substrate automatically changes the relevant parameters to change over the transfer mode between the ordinary mode and the processing solution saving mode. This configuration does not require the operator's operation of changing the parameters and is thus expected to exert an effect of reducing a human error such as erroneous setting. Moreover, the configuration of this aspect automatically detects the slack period having the small demand output and thereby maximizes saving of the processing solution with allowing for a throughput that is lower than the maximum throughput.

[2] According to one aspect, the controller may analyze the transfer time table to determine whether or not the rate-controlling point that limits the processing speed of the entire apparatus for processing the substrate is a point of supply of the substrate to the apparatus for processing the substrate, and determine that the apparatus for processing the substrate is in the slack period when the rate-controlling point is the point of supply of the substrate to the apparatus for processing the substrate, while determining that the apparatus for processing the substrate is not in the slack period when the rate-controlling point is not the point of supply of the substrate to the apparatus for processing the substrate.

The configuration of this aspect analyzes the transfer time table and determines whether or not the supply of the substrate to the apparatus is the rate-controlling point. This allows for determination that the apparatus for processing the substrate is in the slack period with high accuracy. This configuration accordingly enables the transfer mode (the ordinary mode or the processing solution saving mode) to be changed over at the right time and maximizes saving of the processing solution in the slack period, while maximizing the throughput in the peak period.

[3] According to one aspect, the controller may analyze the transfer time table to calculate operation ratios of the plurality of processing tanks and of the transporter, and determine whether or not the rate-controlling point is the point of supply of the substrate to the apparatus for processing the substrate, based on the operation ratios of the plurality of processing tanks and of the transporter.

The configuration of this aspect analyzes the transfer time table and determines whether or not the supply of the substrate is the rate-controlling point, based on the operation ratios of the processing tanks and of the transporter. This allows for determination that the apparatus for processing the substrate is in the slack period with high accuracy. This configuration accordingly enables the transfer mode (the ordinary mode or the processing solution saving mode) to be changed over at the right time and maximizes saving of the processing solution in the slack period, while maximizing the throughput in the peak period.

[4] According to one aspect, the controller may generate the transfer time table in the processing solution saving mode to decrease a pull-out speed of the substrate in at least one of the processing tanks and/or to increase a waiting time after the substrate is pulled out in at least one of the processing tanks, compared with the transfer time table in the ordinary mode.

The configuration of this aspect decreases the pull-out speed of the substrate in the processing tank and/or increases the waiting time after the pull-out of the substrate in the processing tank and thereby enables a larger amount of the processing solution adhering to the substrate and/or the substrate holder to be returned to the processing tank. This accordingly saves the processing solution.

In the slack period, the configuration of elongating the pull-out time of the substrate (decreasing the pull-out speed of the substrate and/or increasing the waiting time after the pull-out of the substrate) in such a range that satisfies a condition that the point of supply of the substrate to the apparatus for processing the substrate is the rate-controlling point elongates the pull-out time of the substrate in the processing tank and enables the processing solution to be returned to the processing tank, while suppressing an excessive decrease in the throughput.

[5] According to one aspect, the controller may regulate an amount of decreasing the pull-out speed of the substrate in at least one of the processing tanks and/or an amount of increasing the waiting time after the substrate is pulled out in at least one of the processing tanks, according to the operation ratios of the plurality of processing tanks and of the transporter.

The configuration of this aspect elongates the pull-out time of the substrate in the processing tank (decreases the pull-out speed of the substrate and/or increases the waiting time after the pull-out of the substrate) with a decrease in the operation ratios of the processing tanks and the transporter and thereby increases the saving amount of the processing solution.

[6] According to one aspect, the controller may determine whether or not the apparatus for processing the substrate is in the slack period, based on a number of substrates present in the apparatus for processing the substrate and presence or absence of any subsequent job or a number of subsequent jobs to be processed in the apparatus for processing the substrate.

The configuration of this aspect allows for determination of whether or not the apparatus for processing the substrate is in the slack period by the simple processing, based on the number of substrates present in the apparatus for processing the substrate and the presence or the absence of any subsequent job or the number of subsequent jobs to be processed in the apparatus for processing the substrate. The configuration of this aspect also allows for indirect determination of whether or not the supply of the substrate to the apparatus is the rate-controlling point, based on the number of substrates present in the apparatus for processing the substrate and the presence or the absence of any subsequent job or the number of subsequent jobs to be processed in the apparatus for processing the substrate.

[7] According to one aspect, the controller may be configured to receive an input for enabling or disabling a setting to the processing solution saving mode, from a user, and the controller may be allowed to disable the setting to the processing solution saving mode, based on the input from the user.

The configuration of this aspect enables the setting to the processing solution saving mode to be disabled when the user does not demand to automatically change over the setting to the processing solution saving mode. This configuration enables the changeover to the processing solution saving mode to be enabled or disabled according to the user's requirement to give priority to saving of the processing solution or to give priority to the throughput.

[8] According to one aspect, the controller may be configured to receive an input for setting to the ordinary mode or to the processing solution saving mode, from a user, and the controller may be allowed to change over to the ordinary mode or to the processing solution saving mode, based on the input from the user.

The configuration of this aspect enables the transfer mode to be manually changed over when the user requires to change over the transfer mode or when the transfer mode is unintentionally changed over.

[9] According to one aspect, there is provided a controller of controlling an apparatus for processing a substrate, comprising a plurality of processing tanks configured to perform processing of the substrate; and a transporter configured to transfer the substrate. The controller is configured to generate a transfer time table that causes the substrate to be transferred between the plurality of processing tanks and to be processed, and configured to control the transfer of the substrate by the transporter and the processing of the substrate in the plurality of processing tanks, based on the transfer time table. The controller is configured to change over the transfer time table between an ordinary mode that has a maximum throughput of the apparatus for processing the substrate and a processing solution saving mode that saves a processing solution in at least one of the processing tanks. The controller is configured to determine whether or not the apparatus for processing the substrate is in a slack period that has a small demand output by the apparatus for processing the substrate, based on a rate-controlling point that limits a processing speed of the entire apparatus for processing the substrate, and configured to set the transfer time table to the processing solution saving mode when it is determined that the apparatus for processing the substrate is in the slack period, and to set the transfer time table to the ordinary mode when it is determined that the apparatus for processing the substrate is not in the slack period.

[10] According to one aspect, there is provided a method of controlling an apparatus for processing a substrate, comprising a plurality of processing tanks configured to perform processing of the substrate; and a transporter configured to transfer the substrate. The method comprises: generating a transfer time table that causes the substrate to be transferred between the plurality of processing tanks and to be processed, and controlling the transfer of the substrate by the transporter and the processing of the substrate in the plurality of processing tanks, based on the transfer time table; changing over the transfer time table between an ordinary mode that has a maximum throughput of the apparatus for processing the substrate and a processing solution saving mode that saves a processing solution in at least one of the processing tanks; and determining whether or not the apparatus for processing the substrate is in a slack period that has a small demand output by the apparatus for processing the substrate, based on a rate-controlling point that limits a processing speed of the entire apparatus for processing the substrate, and setting the transfer time table to the processing solution saving mode when it is determined that the apparatus for processing the substrate is in the slack period, while setting the transfer time table to the ordinary mode when it is determined that the apparatus for processing the substrate is not in the slack period.

[11] According to one aspect, there is provided a storage medium configured to store therein a program that causes a computer to perform controlling of an apparatus for processing a substrate, comprising a plurality of processing tanks configured to perform processing of the substrate; and a transporter configured to transfer the substrate. The program causes the computer to perform: generating a transfer time table that causes the substrate to be transferred between the plurality of processing tanks and to be processed, and controlling the transfer of the substrate by the transporter and the processing of the substrate in the plurality of processing tanks, based on the transfer time table; changing over the transfer time table between an ordinary mode that has a maximum throughput of the apparatus for processing the substrate and a processing solution saving mode that saves a processing solution in at least one of the processing tanks; and determining whether or not the apparatus for processing the substrate is in a slack period that has a small demand output by the apparatus for processing the substrate, based on a rate-controlling point that limits a processing speed of the entire apparatus for processing the substrate, and setting the transfer time table to the processing solution saving mode when it is determined that the apparatus for processing the substrate is in the slack period, while setting the transfer time table to the ordinary mode when it is determined that the apparatus for processing the substrate is not in the slack period.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited.

This application claims priority on Japanese Patent Application No. 2021-199133 filed in Japan on Dec. 8, 2021. The entire disclosure of Japanese Patent Application No. 2021-199133 filed in Japan on Dec. 8, 2021, including specification, claims, drawings and abstract, is hereby incorporated by reference herein in its entireties.

The entire disclosure of Japanese Unexamined Patent Publication No. 2011-146448 (Patent Document 1) and Japanese Unexamined Patent Publication No. 2019-133998 (Patent Document 2), including specification, claims, drawings and abstract, is hereby incorporated by reference herein in its entireties.

REFERENCE SIGNS LIST 100 substrate processing apparatus
101A loading/unloading station
101B processing station
102 cassette table
103 transfer robot
104 aligner
105 substrate mounting/demounting station
105a substrate mounting/demounting device
106 spin rinse dryer
107 stocker
108 pre-wet module
109 pre-soak module
110a pre-soak rinse module
111 blow module
110b rinse module
112 plating process module
112a plating tank (cell)
113 substrate holder transfer device
114 transporter (carrier machine)
115 transporter (carrier machine)
116 rail
120 device computer
120A CPU
120B memory
120C operation screen application
120D transfer scheduler
121 device controller
130 operation device

What is claimed is:

1. An apparatus for processing a substrate, comprising:
a plurality of processing tanks configured to perform processing of the substrate;
a transporter configured to transfer the substrate; and
a controller configured to generate a transfer time table that causes the substrate to be transferred between the plurality of processing tanks and to be processed, and configured to control the transfer of the substrate by the transporter and the processing of the substrate in the plurality of processing tanks, based on the transfer time table, wherein
the controller is configured to change over the transfer time table between an ordinary mode that has a maximum throughput of the apparatus for processing the substrate and a processing solution saving mode that saves a processing solution in at least one of the processing tanks, and wherein the controller determines whether or not the apparatus for processing the substrate is in a slack period that has a small demand output by the apparatus for processing the substrate, based on a rate-controlling point that limits a processing speed of the entire apparatus for processing the substrate, and sets the transfer time table to the processing solution saving mode when it is determined that the apparatus for processing the substrate is in the slack period, while setting the transfer time table to the ordinary mode when it is determined that the apparatus for processing the substrate is not in the slack period,
wherein the controller analyzes the transfer time table to determine whether or not the rate-controlling point that limits the processing speed of the entire apparatus for processing the substrate is a point of supply of the substrate to the apparatus for processing the substrate, and determines that the apparatus for processing the substrate is in the slack period when the rate-controlling point is the point of supply of the substrate to the apparatus for processing the substrate, while determining that the apparatus for processing the substrate is not in the slack period when the rate-controlling point is not the point of supply of the substrate to the apparatus for processing the substrate.

2. The apparatus for processing the substrate according to claim 1,
wherein the controller analyzes the transfer time table to calculate operation ratios of the plurality of processing tanks and of the transporter, and determines whether or not the rate-controlling point is the point of supply of the substrate to the apparatus for processing the substrate, based on the operation ratios of the plurality of processing tanks and of the transporter.

3. The apparatus for processing the substrate according to claim 1,
wherein the controller generates the transfer time table in the processing solution saving mode to decrease a pull-out speed of the substrate in at least one of the processing tanks and/or to increase a waiting time after the substrate is pulled out in at least one of the processing tanks, compared with the transfer time table in the ordinary mode.

4. The apparatus for processing the substrate according to claim 2,
wherein the controller generates the transfer time table in the processing solution saving mode to decrease a pull-out speed of the substrate in at least one of the processing tanks and/or to increase a waiting time after the substrate is pulled out in at least one of the processing tanks, compared with the transfer time table in the ordinary mode, wherein the controller regulates an amount of decreasing the pull-out speed of the substrate in at least one of the processing tanks and/or an amount of increasing the waiting time after the substrate is pulled out in at least one of the processing tanks, according to the operation ratios of the plurality of processing tanks and of the transporter.

5. The apparatus for processing the substrate according to claim 1,
wherein the controller is configured to receive an input for enabling or disabling a setting to the processing solution saving mode, from a user, and
the controller is allowed to disable the setting to the processing solution saving mode, based on the input from the user.

6. The apparatus for processing the substrate according to claim 1, wherein the controller is configured to receive an input for setting to the ordinary mode or to the processing solution saving mode, from a user, and the controller is allowed to change over to the ordinary mode or to the processing solution saving mode, based on the input from the user.

7. An apparatus for processing a substrate, comprising:

a plurality of processing tanks configured to perform processing of the substrate;

a transporter configured to transfer the substrate; and a controller configured to generate a transfer time table that causes the substrate to be transferred between the plurality of processing tanks and to be processed, and configured to control the transfer of the substrate by the transporter and the processing of the substrate in the plurality of processing tanks, based on the transfer time table, wherein the controller is configured to change over the transfer time table between an ordinary mode that has a maximum throughput of the apparatus for processing the substrate and a processing solution saving mode that saves a processing solution in at least one of the processing tanks, and wherein the controller determines whether or not the apparatus for processing the substrate is in a slack period that has a small demand output by the apparatus for processing the substrate, based on a rate-controlling point that limits a processing speed of the entire apparatus for processing the substrate, and sets the transfer time table to the processing solution saving mode when it is determined that the apparatus for processing the substrate is in the slack period, while setting the transfer time table to the ordinary mode when it is determined that the apparatus for processing the substrate is not in the slack period, wherein the controller determines whether or not the apparatus for processing the substrate is in the slack period, based on a number of substrates present in the apparatus for processing the substrate and presence or absence of any subsequent job or a number of subsequent jobs to be processed in the apparatus for processing the substrate.

8. The apparatus for processing the substrate according to claim 7, wherein the controller generates the transfer time table in the processing solution saving mode to decrease a pull-out speed of the substrate in at least one of the processing tanks and/or to increase a waiting time after the substrate is pulled out in at least one of the processing tanks, compared with the transfer time table in the ordinary mode.

9. The apparatus for processing the substrate according to claim 7, wherein the controller is configured to receive an input for enabling or disabling a setting to the processing solution saving mode, from a user, and the controller is allowed to disable the setting to the processing solution saving mode, based on the input from the user.

10. The apparatus for processing the substrate according to claim 7, wherein the controller is configured to receive an input for setting to the ordinary mode or to the processing solution saving mode, from a user, and the controller is allowed to change over to the ordinary mode or to the processing solution saving mode, based on the input from the user.

11. A method of controlling an apparatus for processing a substrate, comprising a plurality of processing tanks configured to perform processing of the substrate; and a transporter configured to transfer the substrate, the method comprising:

generating a transfer time table that causes the substrate to be transferred between the plurality of processing tanks and to be processed, and controlling the transfer of the substrate by the transporter and the processing of the substrate in the plurality of processing tanks, based on the transfer time table;

changing over the transfer time table between an ordinary mode that has a maximum throughput of the apparatus for processing the substrate and a processing solution saving mode that saves a processing solution in at least one of the processing tanks; and determining whether or not the apparatus for processing the substrate is in a slack period that has a small demand output by the apparatus for processing the substrate, based on a rate-controlling point that limits a processing speed of the entire apparatus for processing the substrate, and setting the transfer time table to the processing solution saving mode when it is determined that the apparatus for processing the substrate is in the slack period, while setting the transfer time table to the ordinary mode when it is determined that the apparatus for processing the substrate is not in the slack period, wherein determining whether or not the apparatus for processing the substrate is in a slack period that has a small demand output by the apparatus for processing the substrate based on the rate-controlling point that limits the processing speed of the entire apparatus for processing the substrate includes:

analyzing the transfer time table to determine whether or not the rate-controlling point that limits the processing speed of the entire apparatus for processing the substrate is a point of supply of the substrate to the apparatus for processing the substrate, and determining that the apparatus for processing the substrate is in the slack period when the rate-controlling point is the point of supply of the substrate to the apparatus for processing the substrate, while determining that the apparatus for processing the substrate is not in the slack period when the rate-controlling point is not the point of supply of the substrate to the apparatus for processing the substrate.

12. A method of controlling an apparatus for processing a substrate, comprising a plurality of processing tanks configured to perform processing of the substrate; and a transporter configured to transfer the substrate, the method comprising:

generating a transfer time table that causes the substrate to be transferred between the plurality of processing tanks and to be processed, and controlling the transfer of the substrate by the transporter and the processing of the substrate in the plurality of processing tanks, based on the transfer time table;

changing over the transfer time table between an ordinary mode that has a maximum throughput of the apparatus for processing the substrate and a processing solution saving mode that saves a processing solution in at least one of the processing tanks; and determining whether or not the apparatus for processing the substrate is in a slack period that has a small demand output by the apparatus for processing the substrate, based on a rate-controlling point that limits a processing speed of the entire apparatus for processing the substrate, and setting the transfer time table to the processing solution saving mode when it is determined that the apparatus for processing the substrate is in the slack period, while setting the transfer time table to the ordinary mode when it is determined that the apparatus for processing the substrate is not in the slack period, wherein determining whether or not the apparatus for processing the substrate is in a slack period that has a small demand output by the apparatus for processing the substrate based on the rate-controlling point that limits the processing speed of the entire apparatus for processing the substrate includes:

determining whether or not the apparatus for processing the substrate is in the slack period, based on a number of substrates present in the apparatus for processing the substrate and presence or absence of any subsequent job or a number of subsequent jobs to be processed in the apparatus for processing the substrate.

13. A controller for controlling an apparatus for processing a substrate, comprising a plurality of processing tanks configured to perform processing of the substrate; and a transporter configured to transfer the substrate, the controller being configured to generate a transfer time table that causes the substrate to be transferred between the plurality of processing tanks and to be processed, and configured to control the transfer of the substrate by the transporter and the processing of the substrate in the plurality of processing tanks, based on the transfer time table, the controller being configured to change over the transfer time table between an ordinary mode that has a maximum throughput of the apparatus for processing the substrate and a processing solution saving mode that saves a processing solution in at least one of the processing tanks, and the controller being configured to determine whether or not the apparatus for processing the substrate is in a slack period that has a small demand output by the apparatus for processing the substrate, based on a rate-controlling point that limits a processing speed of the entire apparatus for processing the substrate, and configured to set the transfer time table to the processing solution saving mode when it is determined that the apparatus for processing the substrate is in the slack period, and to set the transfer time table to the ordinary mode when it is determined that the apparatus for processing the substrate is not in the slack period, wherein the controller analyzes the transfer time table to determine whether or not the rate-controlling point that limits the processing speed of the entire apparatus for processing the substrate is a point of supply of the substrate to the apparatus for processing the substrate, and determines that the apparatus for processing the substrate is in the slack period when the rate-controlling point is the point of supply of the substrate to the apparatus for processing the substrate, while determining that the apparatus for processing the substrate is not in the slack period when the rate-controlling point is not the point of supply of the substrate to the apparatus for processing the substrate.

14. A controller for controlling an apparatus for processing a substrate, comprising a plurality of processing tanks configured to perform processing of the substrate; and a transporter configured to transfer the substrate, the controller being configured to generate a transfer time table that causes the substrate to be transferred between the plurality of processing tanks and to be processed, and configured to control the transfer of the substrate by the transporter and the processing of the substrate in the plurality of processing tanks, based on the transfer time table, the controller being configured to change over the transfer time table between an ordinary mode that has a maximum throughput of the apparatus for processing the substrate and a processing solution saving mode that saves a processing solution in at least one of the processing tanks, and the controller being configured to determine whether or not the apparatus for processing the substrate is in a slack period that has a small demand output by the apparatus for processing the substrate, based on a rate-controlling point that limits a processing speed of the entire apparatus for processing the substrate, and configured to set the transfer time table to the processing solution saving mode when it is determined that the apparatus for processing the substrate is in the slack period, and to set the transfer time table to the ordinary mode when it is determined that the apparatus for processing the substrate is not in the slack period, wherein the controller determines whether or not the apparatus for processing the substrate is in the slack period, based on a number of substrates present in the apparatus for processing the substrate and presence or absence of any subsequent job or a number of subsequent jobs to be processed in the apparatus for processing the substrate.

15. A storage medium configured to store therein a program that causes a computer to perform controlling of an apparatus for processing a substrate, comprising a plurality of processing tanks configured to perform processing of the substrate; and a transporter configured to transfer the substrate, the program causing the computer to perform:

generating a transfer time table that causes the substrate to be transferred between the plurality of processing tanks and to be processed, and controlling the transfer of the substrate by the transporter and the processing of the substrate in the plurality of processing tanks, based on the transfer time table;

changing over the transfer time table between an ordinary mode that has a maximum throughput of the apparatus for processing the substrate and a processing solution saving mode that saves a processing solution in at least one of the processing tanks; and determining whether or not the apparatus for processing the substrate is in a slack period that has a small demand output by the apparatus for processing the substrate, based on a rate-controlling point that limits a processing speed of the entire apparatus for processing the substrate, and setting the transfer time table to the processing solution saving mode when it is determined that the apparatus for processing the substrate is in the slack period, while setting the transfer time table to the ordinary mode when it is determined that the apparatus for processing the substrate is not in the slack period, wherein determining whether or not the apparatus for processing the substrate is in a slack period that has a small demand output by the apparatus for processing the substrate based on the rate-controlling point that limits the processing speed of the entire apparatus for processing the substrate includes:

analyzing the transfer time table to determine whether or not the rate-controlling point that limits the processing speed of the entire apparatus for processing the substrate is a point of supply of the substrate to the apparatus for processing the substrate, and determining that the apparatus for processing the substrate is in the slack period when the rate-controlling point is the point of supply of the substrate to the apparatus for processing the substrate, while determining that the apparatus for processing the substrate is not in the slack period when the rate-controlling point is not the point of supply of the substrate to the apparatus for processing the substrate.

16. A storage medium configured to store therein a program that causes a computer to perform controlling of an apparatus for processing a substrate, comprising a plurality of processing tanks configured to perform processing of the substrate; and a transporter configured to transfer the substrate, the program causing the computer to perform:

generating a transfer time table that causes the substrate to be transferred between the plurality of processing tanks and to be processed, and controlling the transfer of the substrate by the transporter and the processing of the substrate in the plurality of processing tanks, based on the transfer time table;

changing over the transfer time table between an ordinary mode that has a maximum throughput of the apparatus for processing the substrate and a processing solution saving mode that saves a processing solution in at least one of the processing tanks; and determining whether or not the apparatus for processing the substrate is in a slack period that has a small demand output by the apparatus for processing the substrate, based on a rate-controlling point that limits a processing speed of the entire apparatus for processing the substrate, and setting the transfer time table to the processing solution saving mode when it is determined that the apparatus for processing the substrate is in the slack period, while setting the transfer time table to the ordinary mode when it is determined that the apparatus for processing the substrate is not in the slack period, wherein determining whether or not the apparatus for processing the substrate is in a slack period that has a small demand output by the apparatus for processing the substrate based on the rate-controlling point that limits the processing speed of the entire apparatus for processing the substrate includes:

determining whether or not the apparatus for processing the substrate is in the slack period, based on a number of substrates present in the apparatus for processing the substrate and presence or absence of any subsequent job or a number of subsequent jobs to be processed in the apparatus for processing the substrate.

* * * * *